(12) United States Patent
Kim et al.

(10) Patent No.: US 11,742,632 B2
(45) Date of Patent: Aug. 29, 2023

(54) NANOCAVITY MONOLAYER LASER MONOLITHICALLY INTEGRATED WITH LED PUMP

(71) Applicant: INTERNATIONAL BUSINESS MACHINES CORPORATION, Armonk, NY (US)

(72) Inventors: Jeehwan Kim, Los Angeles, CA (US); Ning Li, White Plains, NY (US); Devendra K. Sadana, Pleasantville, NY (US); Brent A. Wacaser, Putnam Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1021 days.

(21) Appl. No.: 16/522,873

(22) Filed: Jul. 26, 2019

(65) Prior Publication Data
US 2019/0363513 A1 Nov. 28, 2019

Related U.S. Application Data

(62) Division of application No. 14/799,395, filed on Jul. 14, 2015, now Pat. No. 10,431,956.

(51) Int. Cl.
*H01S 5/10* (2021.01)
*H01S 3/0933* (2006.01)
(Continued)

(52) U.S. Cl.
CPC .......... *H01S 5/1042* (2013.01); *H01S 3/0933* (2013.01); *H01S 5/041* (2013.01);
(Continued)

(58) Field of Classification Search
CPC ...... H01S 5/1042; H01S 3/0933; H01S 5/041; H01S 5/1067; H01S 5/11; H01S 5/30; H01S 5/026
See application file for complete search history.

(56) References Cited

U.S. PATENT DOCUMENTS

| 4,872,046 A | 10/1989 | Morkoc et al. |
| 8,404,336 B2 | 3/2013 | Johnson et al. |

(Continued)

FOREIGN PATENT DOCUMENTS

| WO | WO2014043045 A1 | 3/2014 |
| WO | WO2014164960 A1 | 10/2014 |

OTHER PUBLICATIONS

Pospischil, A., et al., "Electrically driven light emission from an atomic monolayer crystal," Conference on Lasers and Electro-Optics (CLEO), Jun. 2014. (pp. 1-2).

(Continued)

*Primary Examiner* — M. A. Golub-Miller
(74) *Attorney, Agent, or Firm* — Tutunjian & Bitetto, P.C.; Samuel Waldbaum

(57) ABSTRACT

A laser structure including a Si or Ge substrate, a III-V buffer layer formed on the substrate, a light emitting diode (LED) formed on the buffer layer configured to produce visible light, a lens disposed on the LED to focus light from the LED, a photonic crystal layer formed on the LED to receive the light focused by the lens, and a monolayer semiconductor nanocavity laser formed on the photonic crystal layer for receiving light through the photonic crystal layer from the LED. The LED and the laser are formed monolithically and the LED acts as an optical pump for the laser.

20 Claims, 4 Drawing Sheets

(51) Int. Cl.
*H01S 5/04* (2006.01)
*H01S 5/30* (2006.01)
*H01S 5/11* (2021.01)
*H01S 5/026* (2006.01)
*H01L 33/58* (2010.01)

(52) U.S. Cl.
CPC .............. *H01S 5/1067* (2013.01); *H01S 5/11* (2021.01); *H01S 5/30* (2013.01); *H01L 33/58* (2013.01); *H01L 2933/0058* (2013.01); *H01L 2933/0083* (2013.01); *H01S 5/026* (2013.01)

(56) References Cited

U.S. PATENT DOCUMENTS

| | | | |
|---|---|---|---|
| 10,008,826 B1* | 6/2018 | Padullaparthi | H01S 5/18377 |
| 10,348,058 B1* | 7/2019 | Gwo | H01S 5/187 |
| 2003/0152228 A1* | 8/2003 | Gerard | B82Y 20/00 |
| | | | 380/220 |
| 2005/0158898 A1* | 7/2005 | Scherer | G02B 6/1225 |
| | | | 977/709 |
| 2010/0074293 A1 | 3/2010 | Lochmann et al. | |
| 2010/0301307 A1* | 12/2010 | Fattal | H01L 33/30 |
| | | | 257/14 |
| 2014/0017839 A1 | 1/2014 | Li et al. | |
| 2014/0131696 A1 | 5/2014 | Kim et al. | |
| 2014/0226691 A1* | 8/2014 | Kim | H01S 5/1042 |
| | | | 372/45.01 |
| 2015/0109606 A1 | 4/2015 | Peale et al. | |
| 2016/0141836 A1* | 5/2016 | Leobandung | H01L 33/24 |
| | | | 372/45.01 |
| 2016/0365480 A1* | 12/2016 | Ml | H01L 33/06 |
| 2017/0012405 A1* | 1/2017 | Li | H01S 5/1039 |
| 2020/0035861 A1* | 1/2020 | Li | H01L 31/072 |
| 2022/0006027 A1* | 1/2022 | Forrest | H01L 51/0059 |

OTHER PUBLICATIONS

Wu, A., et al., "Monolayer semiconductor nanocavity lasers with ultralow thresholds," Nature, vol. 520, Apr. 2015. (pp. 1-8).
List of IBM Patents or Patent Applications Treated as Related dated Jul. 26, 2019, 2 pages.
Final Office Action from U.S. Appl. No. 16/522,908 dated Mar. 30, 2023 (14 pages).

* cited by examiner

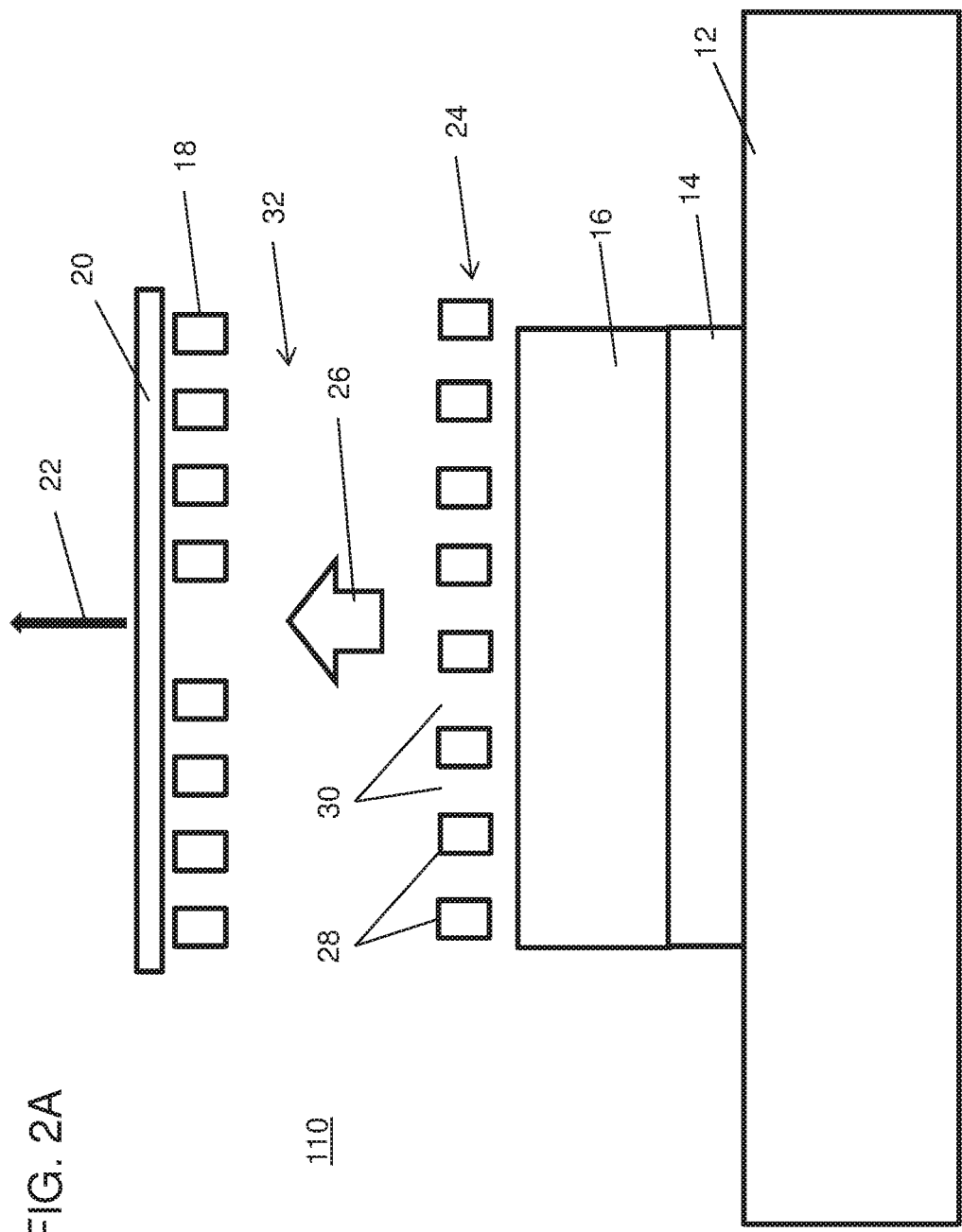

NANOCAVITY MONOLAYER LASER MONOLITHICALLY INTEGRATED WITH LED PUMP

BACKGROUND

Technical Field

The present invention relates to lasers, and more particularly to a monolithically integrated laser that is optically pumped by a light emitting diode.

Description of the Related Art

Enhanced light output for nanoscale lasers enables accurate and repeatable output in many technical environments. For example, nanolasers can be modulated quickly and, combined with their small footprint, can be employed for on-chip optical computing. The intense optical fields of such a laser also enable the enhancement effect in non-linear optics or surface-enhanced-Raman-scattering (SERS), and can be employed in integrated nanophotonic circuits.

SUMMARY

A laser structure includes a substrate, a buffer layer formed on the substrate and a light emitting diode (LED) formed on the buffer layer. A photonic crystal layer is formed on the LED. A monolayer semiconductor nanocavity laser is formed on the photonic crystal layer for receiving light through the photonic crystal layer from the LED, wherein the LED and the laser are formed monolithically and the LED acts as an optical pump for the laser.

A laser structure includes a Si or Ge substrate and a III-V buffer layer formed on the substrate. A light emitting diode (LED) is formed on the buffer layer and configured to produce visible light. A lens is disposed on the LED to focus light from the LED. A photonic crystal layer is formed on the LED to receive the light focused by the lens. A monolayer semiconductor nanocavity laser is formed on the photonic crystal layer for receiving light through the photonic crystal layer from the LED, wherein the LED and the laser are formed monolithically and the LED acts as an optical pump for the laser.

A laser structure including a monolithically formed nanocavity laser and light emitting diode (LED) includes a substrate including at least one of silicon (Si) and germanium (Ge), a buffer layer including a III-V material and having a first surface formed on the substrate, a light emitting diode (LED) formed on a second surface of the buffer layer and configured to produce visible light, a lens disposed on the LED to focus the visible light to output focused light, a photonic crystal layer formed on the LED to receive the focused light, and a nanocavity laser formed on the photonic crystal layer and including a monolayer of a transition metal dichalcogenide having a chemical formula of $MX_2$ for receiving the focused light through the photonic crystal layer to optically pump the nanocavity laser. M is selected from the group consisting of: W and Mo and X is selected from the group consisting of: S, Se and Te. The buffer layer further includes an interface material to reduce dislocation defects due to lattice mismatch between the substrate and the buffer layer in order for the nanocavity laser and the LED to be monolithically formed within the laser structure.

A method for forming a pumped laser structure includes forming a III-V buffer layer on a substrate including one of Si or Ge; forming a light emitting diode (LED) on the buffer layer configured to produce a threshold pump power; forming a photonic crystal layer on the LED and depositing a monolayer semiconductor nanocavity laser on the photonic crystal layer for receiving light through the photonic crystal layer from the LED with an optical pump power greater than the threshold pump power, wherein the LED and the laser are formed monolithically and the LED functions as an optical pump for the laser.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 2A is a cross-sectional schematic view of a laser structure including a light emitting diode optical light pump having emitted light focused by a lens for a monolayer semiconductor nanocavity laser in accordance with the present principles;

DETAILED DESCRIPTION

Figure 1:
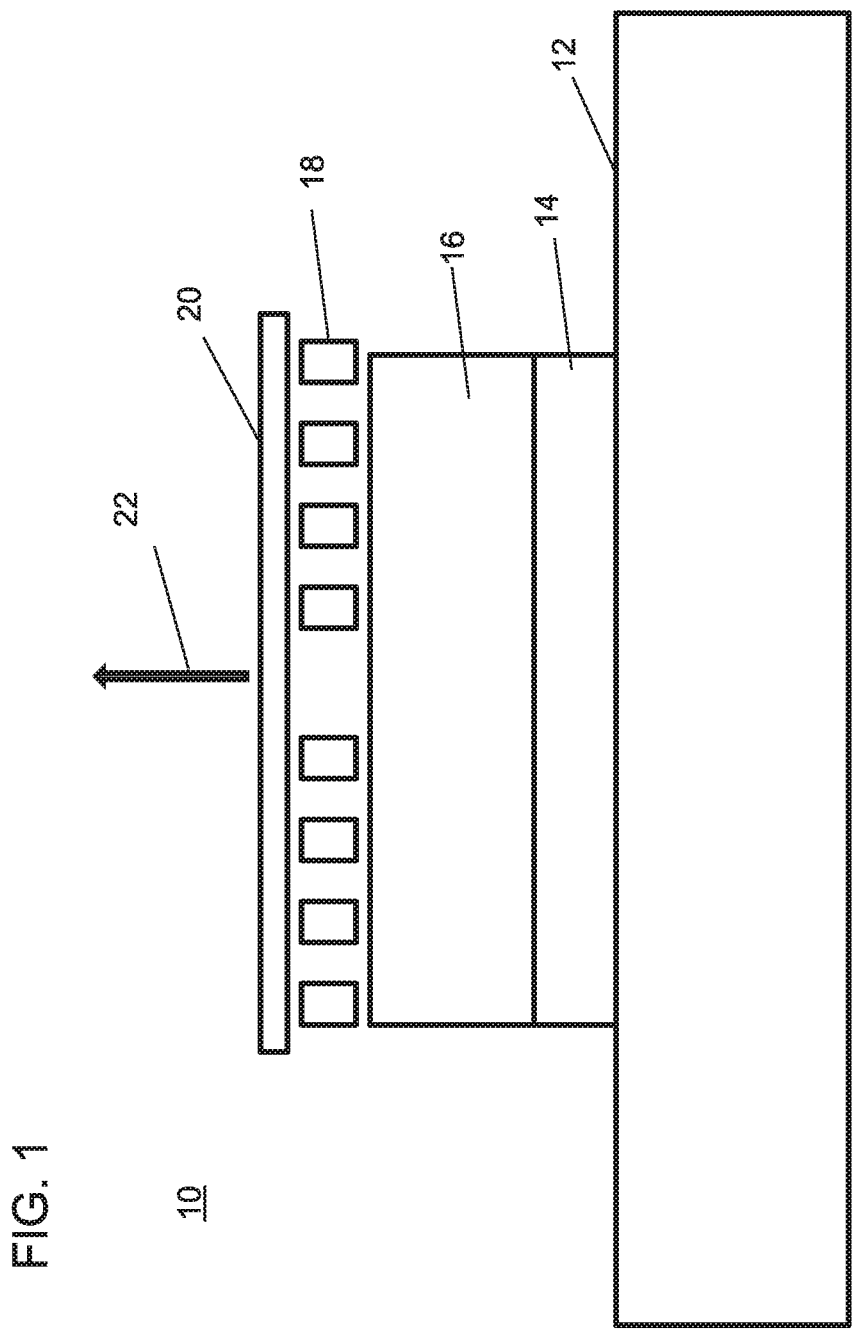
FIG. 1 is a cross-sectional schematic view of a laser structure including a light emitting diode optical light pump for a monolayer semiconductor nanocavity laser in accordance with the present principles.

In accordance with the present principles, lasers, and more specifically nanolasers are provided that increase output power. In one embodiment, the nanolasers employ an optical pump to increase their output. By employing monolayer semiconductor lasers, the optical pump may be provided by a light emitting diode (LED). In a particularly useful embodiment, the LED can be monolithically integrated with the laser. In this way, efficiency and power are maximized. In addition, a compact and powerful laser can be integrated into integrated circuit (IC) devices and may include on-chip lasing applications.

In one embodiment, monolayers of two-dimensional (2D) materials are employed in a quantum stack between dielectric materials. In one embodiment, the 2D material includes $WSe_2$. transition metal dichalcogenide laser may be formed on the LED. The monolayer transition metal dichalcogenide may include $WSe_2$, although other materials may be employed. The laser may be formed on a photonic crystal cavity to further enhance light output power. The photonic crystal cavity is formed on the LED, and the LED may include III-V materials, although other materials may also be employed.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may be integrated on ICs. A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., GaInP, InGaAs, AlGaInP, etc. These compounds include different proportions of the elements within the compound, e.g., InGaAs includes $In_x Ga_y As_{1-x-y}$, where x, y are less than or equal to 1, etc. In addition, other elements may be included in the compound, such as, e.g., AlInGaAs, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, an optically pumped laser 10 is shown in accordance with one illustrative embodiment. The laser 10 is formed on a substrate 12. The substrate 12 may include any suitable monocrystalline material. In one particularly useful embodiment, the substrate 12 may include Ge or Si. While other materials may be employed, e.g., GaAs, etc., Ge and/or Si provide the most beneficial materials due to their availability and ease of manufacture. In other embodiments, the substrate 12 may include a semiconductor-on-insulator (SOI) structure. The SOI structure includes a base substrate, a buried dielectric layer (e.g., oxide) and a thinner semiconductor layer. The semiconductor layer may include Si (silicon-on-insulator) or Ge (germanium-on-insulator). Some advantages for employing silicon or germanium substrates 12 include the larger size (more chips per wafer), reduced cost over substrates made with other materials (e.g., III-V materials) and silicon or germanium substrates are compatible with common processing techniques and platforms.

A buffer layer 14 is grown on the substrate 12. The buffer layer 14 may include a monocrystalline structure. The buffer layer 14 may be grown using molecular beam epitaxy (MBE) or metal organic chemical vapor deposition (MOCVD), although other processes may be employed to grow monocrystalline materials. The buffer layer 14 being grown on the substrate 12 may include an interface material that attempts to minimize dislocation defects due to lattice mismatch between the substrate 12 and the buffer layer 14 materials. The materials for the buffer layer 14 may include, e.g., GaAs, AlGaAs, InP, InGaAs, GaN, GaP, or other III-V materials or combinations thereof.

Once the buffer layer 14 is formed, additional layers may be formed on the buffer layer 14 to fabricate a light emitting diode 16. In one embodiment, III-V materials are grown on the buffer layer 14 to form the diode 16. The diode 16 may include AlGaAs, AlGaNInP or other materials. The diode 16 includes n and p doped active regions to form a p-n junction or junctions. The buffer layer 14 and the layers forming the diode 16 may be patterned in a single lithographic processing step.

It should be understood that a plurality of different diode structures may be employed in diode layer 16. In particularly useful embodiments, a TS-LED (transparent substrate) may be employed, although other types of diodes may be employed, e.g., ODR-LED (omni-direction reflector), DBR-LED (distributed Bragg reflector), etc. The diode 16 needs to achieve a threshold pump power to be useful as an optical pump. In one embodiment, the threshold power needed to achieve the pump threshold is, e.g., about 100 mW/mm². An AlGaInP (or AlGaAs) TS-LED (16) can achieve this threshold power (e.g., 100 mW/mm²) at room temperature (e.g., 300K).

In one embodiment, LED 16 provides a 25 mW output using a 40 mA injection current over an area of 0.25 mm$^2$ to achieve the threshold pump power (e.g., 25 mW/0.25 mm$^2$=100 mW/mm$^2$). Other diode types may also be employed. In one embodiment, the LED provides a wavelength output of less than 740 nm to be compatible with some laser structures, as will be described.

A photonic crystal layer 18 is formed on the LED 16. In one embodiment, the photonic crystal layer 18 includes silicon dioxide (SiO$_2$ or silica), which is transparent at visible wavelengths (e.g., less than 740 nm), and silicon materials are low cost, compatible with electronics and established fabrication techniques. Perturbation cavities are provided that modulate the index of refraction in a waveguide system that include low index materials. This creates high-Q cavities in the two dimensional photonic crystal layer 18. The photonic crystal layer 18 guides light emitted from the LED 16 to a monolayer semiconductor nanocavity laser 20 such that the light from the LED 16 pumps the laser 20 to provide sufficient pump power to lase light in the laser 20.

The laser 20 is comprised of materials that preferably include a chemical formula of MX$_2$, where M is W or Mo, and X is S, Se or Te. In one particularly useful embodiment, the laser 20 includes a single layer (monolayer) of WSe$_2$. The monolayer WSe$_2$ laser 20 has a low threshold value (e.g., 100 mW/sq. mm) and outputs laser light 22 using light from the LED 16 to pump the laser 20. The thickness of the laser 20 may be less than about 1 nm (e.g., about 0.7 nm for WSe$_2$).

Referring to FIG. 2A, another optically pumped laser 110 is shown in accordance with an illustrative embodiment. The laser 110 is formed on a substrate 12. The substrate 12 may include any suitable monocrystalline material, e.g., Ge or Si. In other embodiments, the substrate 12 may include a semiconductor-on-insulator structure (SOI). The semiconductor layer of the SOI may include Si (silicon on-insulator) or Ge (germanium-on-insulator). The buffer layer 14 is grown on the substrate 12. The buffer layer 14 may include a monocrystalline structure. The buffer layer 14 may be grown using molecular beam epitaxy (MBE) or metal organic chemical vapor deposition (MOCVD), although other processes may be employed to grow monocrystalline materials. The materials for the buffer layer 14 may include, e.g., GaAs, AlGaAs, InP, InGaAs, GaN, GaP, or other III-V materials or combinations thereof.

Once the buffer layer 14 is formed, additional layers may be formed on the buffer layer 14 to fabricate the light emitting diode 16, e.g., AlGaAs, AlGaNInP or other materials. The diode 16 includes n and p doped active regions to form a p-n junction or junctions.

In a particularly useful embodiment, a lens 24 is formed on the LED 16. The lens 24 may include different structures and is employed to assist in focusing the LED light 26. In one embodiment, the lens 24 includes a plurality of concentric rings 28 as a diffraction grating (e.g., a grating lens). The rings 28 may include opaque dielectric material spaced apart by gaps 30. The gap spacing can be determined in accordance with the wavelength of light being focused. In other embodiments, the rings 28 and gaps 30 may include materials with different indices of refraction. In one embodiment, the rings 28 may include a metal or other material. In other embodiments, the lens 24 may include an optical lens having a curvature or geometric difference to focus the LED light 26.

FIG. 2A schematically shows the lens 24 separated from the photonic crystal 18. A layer 32 may be disposed between the lens 24 the photonic crystal 18. The layer 32 may include an air gap, a transparent dielectric material, a refractive index matched material or any other suitable material.

The photonic crystal layer 18 is formed over the lens 24 and over the LED 16. The photonic crystal layer 18 may include silicon dioxide (SiO$_2$ or silica). Perturbation cavities are provided that modulate the index of refraction in a waveguide system that include low index materials. This creates high-Q cavities in the two dimensional photonic crystal layer 18. The photonic crystal layer 18 guides light focused by the lens 24 to the monolayer semiconductor nanocavity laser 20 such that the light from the LED 16 pumps the laser 20 to provide sufficient pump power to lase light in the laser 20. The laser 20 preferably includes a two-dimensional laser with a monolayer of WSe$_2$.

The laser 20 preferably includes a chemical formula of MX$_2$, where M is W or Mo, and X is S, Se or Te. In one particularly useful embodiment, the laser 20 includes a single layer (monolayer) of WSe$_2$.

Figure 2B:
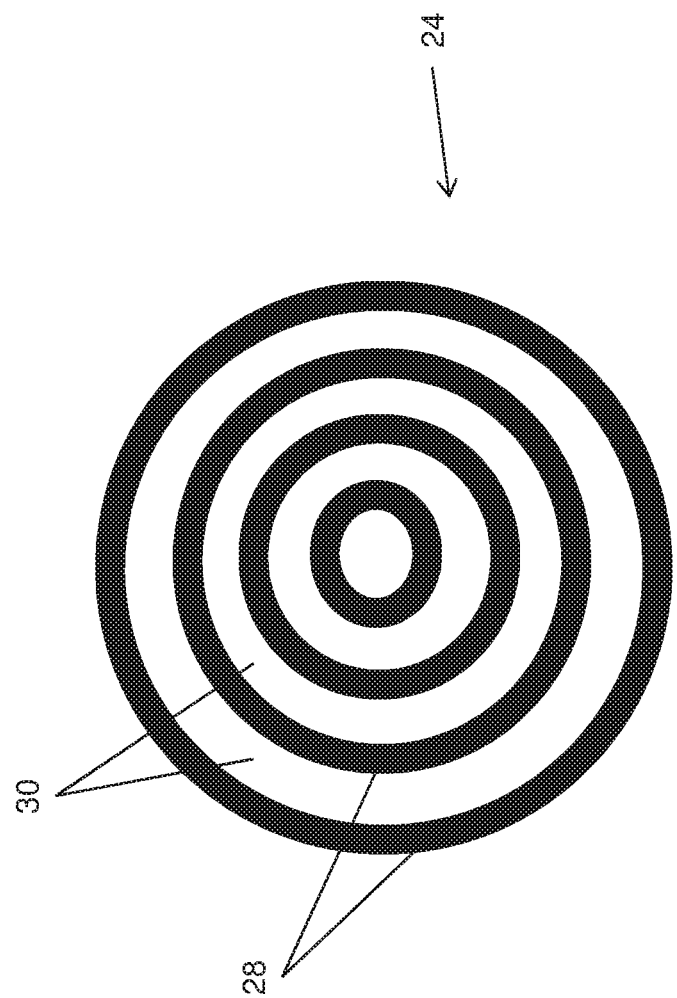
FIG. 2B is a top view of the lens for FIG. 2A in accordance with the present principles.

Referring to FIG. 2B, a top view is illustratively shown for the lens 24 in accordance with one illustrative embodiment. The lens 24 includes concentric rings 28 separated by gaps 30 to form a grating (e.g., a diffraction grating). The rings 28 may include a dielectric layer (e.g., silicon oxide, silicon nitride) etched into concentric circles. The diameters of the concentric circles are chosen properly so that the light of the LED emission wavelength is focused into the center of the concentric circles.

Figure 3:
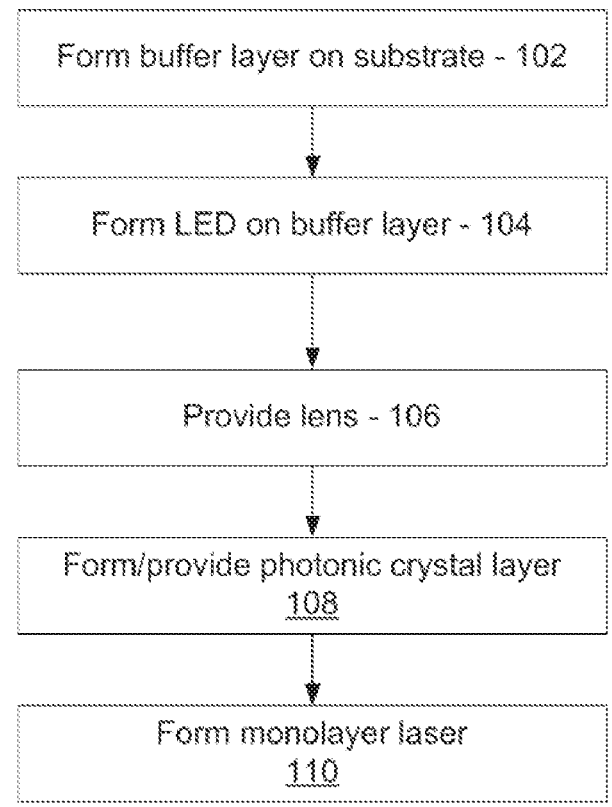
FIG. 3 is a block/flow diagram for forming a pumped laser structure in accordance with one illustrative embodiment.

Referring to FIG. 3, a method for forming a pumped laser structure is shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a III-V buffer layer is formed on a substrate. The substrate preferably includes one of Si or Ge, although other materials may be employed, e.g., III-V materials. The substrate may include a silicon or germanium on-insulator structure. In block 104, a light emitting diode (LED) is formed on the buffer layer. The LED is preferably configured to produce visible light, although other wavelengths may also be implemented. In particularly useful embodiments, light having a wavelength less than 740 nm may be produced by the LED. The LED is configured to produce a threshold pump power. If a WSe$_2$ laser is employed, the threshold pump power is about 100 mW/mm$^2$. The LED may include a plurality of different LED structures including, e.g., TS-LED, DBR-LED, ODR-LED or any other LED capable of providing threshold power for the type of laser selected.

In block 106, an optional lens may be provided between the LED and a photonic crystal cavity. The lens focuses light from the LED on the photonic crystal layer. The lens may include a diffraction grating appropriately dimensioned in accordance with the wavelength of light emitted from the LED. The lens may include an optical lens or any other lens capable of directing and focusing light from the LED.

In block 108, a photonic crystal layer may be formed or provided on the LED. This layer may be included to assist in guiding or directing light between the LED to a laser. In one embodiment, the photonic crystal layer includes a silicon oxide photonic crystal layer.

In block 110, a monolayer semiconductor nanocavity laser is deposited on the photonic crystal layer. The laser receives light through the photonic crystal layer from the LED with an optical pump power greater than the threshold pump power so that the laser can lase light. The LED and the laser are preferably formed monolithically (same structure). The LED functions as an optical pump for the laser. In one especially useful embodiment, the laser includes a monolayer of $WSe_2$, although other materials may be employed.

Having described preferred embodiments for a monolithically integrated laser with LED pump (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A laser structure including a monolithically formed nanocavity laser and light emitting diode (LED), comprising:
   a Si or Ge substrate;
   a III-V buffer layer formed on the substrate;
   a light emitting diode (LED) formed on the buffer layer configured to produce visible light;
   a lens disposed on the LED to focus light from the LED;
   a photonic crystal layer formed on the LED to receive the light focused by the lens; and
   a monolayer semiconductor nanocavity laser formed on the photonic crystal layer for receiving light through the photonic crystal layer from the LED, wherein the LED and the laser are formed monolithically and the LED acts as an optical pump for the laser.

2. The laser structure as recited in claim 1, wherein the laser is a monolayer a $WSe_2$ laser.

3. The laser structure as recited in claim 1, wherein the LED achieves a threshold pump power to enable the laser to produce laser light.

4. The laser structure as recited in claim 1, wherein the LED includes a transparent substrate LED.

5. The laser structure as recited in claim 1, wherein the LED includes AlGaAs or AlGaInP material.

6. The laser structure as recited in claim 1, wherein the buffer layer further includes an interface material to reduce dislocation defects due to lattice mismatch between the Si or Ge substrate and the III-V buffer layer.

7. The laser structure as recited in claim 1, wherein the lens includes a diffraction grating including circular concentric rings.

8. The laser structure as recited in claim 1, wherein the nanocavity laser is a monolayer of a material for receiving the light through the photonic crystal layer from the LED to optically pump the nanocavity laser.

9. The laser structure as recited in claim 8, wherein the monolayer of a material is a monolayer of a transition metal dichalcogenide.

10. The laser structure as recited in claim 9, wherein the transition metal dichalcogenide has a chemical formula of $MX_2$ where M is selected from the group consisting of: W and Mo and X is selected from the group consisting of: S, Se and Te.

11. The laser structure as recited in claim 8,
   wherein the LED produces a light with a threshold pump power that corresponds to the threshold value of the material of the active layer of the nanocavity laser,
   the LED optically pumps the active layer to enable the nanocavity laser to produce an output laser beam.

12. The laser structure as recited in claim 1, wherein the LED includes a III-V material and the photonic crystal layer includes $SiO_2$.

13. A laser structure including a monolithically formed nanocavity laser and light emitting diode (LED), comprising:
   a substrate including silicon (Si) or germanium (Ge);
   a buffer layer including a III-V material and having a first surface formed on the substrate;
   a light emitting diode (LED) formed on a second surface of the buffer layer and configured to produce visible light;
   a lens disposed on the LED to focus the visible light to output focused light;
   a photonic crystal layer formed on the LED to receive the focused light; and
   a nanocavity laser formed on the photonic crystal layer, is a monolayer of a transition metal dichalcogenide having a chemical formula of $MX_2$ for receiving the focused light through the photonic crystal layer to optically pump the nanocavity laser, where M is selected from the group consisting of: W and Mo and X is selected from the group consisting of: S, Se and Te; wherein the buffer layer further includes an interface material to reduce dislocation defects due to lattice mismatch between the substrate and the buffer layer.

14. The laser structure as recited in claim 13, wherein the transition metal dichalcogenide is $WSe_2$.

15. The laser structure as recited in claim 13, wherein the LED includes a III-V material.

16. The laser structure as recited in claim 13, wherein the photonic crystal includes $SiO_2$.

17. The laser structure as recited in claim 13,
   wherein the LED produces a light with a threshold pump power that corresponds to the threshold value of the transition metal dichalcogenide of the active layer of the nanocavity laser,
   the LED optically pumps the active layer to enable the nanocavity laser to produce an output laser beam.

18. The laser structure as recited in claim 13, wherein the LED includes a transparent substrate.

19. The laser structure as recited in claim 13, wherein the LED includes a AlGaAs or AlGaInP material.

20. The laser structure as recited in claim 13, wherein the lens includes a diffraction grating including circular concentric rings.

* * * * *